(12) United States Patent
Yang

(10) Patent No.: US 8,012,800 B2
(45) Date of Patent: Sep. 6, 2011

(54) METHOD OF FABRICATING A STACKED TYPE CHIP PACKAGE STRUCTURE AND A STACKED TYPE PACKAGE STRUCTURE

(75) Inventor: Chau-Chin Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 163 days.

(21) Appl. No.: 12/428,263

(22) Filed: Apr. 22, 2009

(65) Prior Publication Data

US 2009/0298227 A1    Dec. 3, 2009

(30) Foreign Application Priority Data

May 29, 2008   (TW) .............................. 97119932 A

(51) Int. Cl.
  *H01L 21/44*    (2006.01)
  *H01L 21/48*    (2006.01)
  *H01L 21/50*    (2006.01)
(52) U.S. Cl. ......................... 438/108; 438/118; 438/126

(58) Field of Classification Search .................. 438/108, 438/118, 126; 257/E21.502
See application file for complete search history.

(56) References Cited

U.S. PATENT DOCUMENTS

2008/0171402 A1* 7/2008 Karnezos ........................ 438/15

FOREIGN PATENT DOCUMENTS

TW         200608540          3/2006

* cited by examiner

*Primary Examiner* — William M. Brewster
(74) *Attorney, Agent, or Firm* — J.C. Patents

(57) ABSTRACT

A method of fabricating a stacked type chip package structure is provided. The method includes following steps. First, a substrate, a first chip, and a second chip are provided. A number of bumps are disposed on a surface of the second chip. The second chip is then fixed on a surface of the first chip. Next, the second chip and the first chip on the substrate are turned upside down, and then the second chip is electrically connected to the substrate through the bumps by using a flip chip bonding technique. After that, the first chip is electrically connected to the substrate. Finally, a molding compound is formed on the substrate for encapsulating the first chip, the second chip, and the bumps.

20 Claims, 4 Drawing Sheets

METHOD OF FABRICATING A STACKED TYPE CHIP PACKAGE STRUCTURE AND A STACKED TYPE PACKAGE STRUCTURE

CROSS-REFERENCE TO RELATED APPLICATION

This application claims the priority benefit of Taiwan application serial no. 97119932, filed May 29, 2008. The entirety of the above-mentioned patent application is hereby incorporated by reference herein and made a part of this specification.

BACKGROUND OF THE INVENTION

1. Field of the Invention

The present invention is related to a method of fabricating a chip package structure. More particularly, the present invention is related to a method of fabricating a stacked type chip package structure and a stacked type package structure.

2. Description of Related Art

In modern information era, consumers continuously pursue electronic products with high speed, outstanding quality, and multiple functions. The design of exterior appearances of the electronic products reveals a trend of light weight, thinness, small size and compactness. To achieve the above-mentioned objective, many manufacturers integrate a concept of systematization into a circuit design to save the number of chips disposed in an electronic product and to equip one single chip with various functions. On the other hand, in terms of electronic packaging, for the design trend of being light, slim, short, and compact, several package design concepts are developed, such as multi-chip module (MCM), chip scale package (CSP) and a stacked structure of chip packages.

FIGS. 1A to 1D are schematic cross-sectional flowcharts showing a process of fabricating a stacked type package structure disclosed in R.O.C. patent publication no. 200608540. First, referring to FIG. 1A, a package substrate 110 and a first chip 120 are provided, and the first chip 120 is fixed to the package substrate 110 by using a flip chip bonding technique. After the implementation of the flip chip bonding technique, an underfill 130 is formed between the first chip 120 and the package substrate 110, and a baking process is performed to cure the underfill 130. Next, referring to FIG. 1B, a package 150 is fixed to the first chip 120 through an adhesive layer 140. Here, the package 150 includes a CSP substrate 152 and a second chip 154 disposed on and electrically connected to the CSP substrate 152. The package 150 is electrically connected to the package substrate 110 by using a wire bonding technique. Thereafter, referring to FIG. 1C, a third chip 160 is attached to the other surface of the CSP substrate 152 through die attachment, and the third chip 160 is electrically connected to the package substrate 110 by using the wire bonding technique. Finally, referring to FIG. 1D, a molding compound 170 is formed on the package substrate 110 for encapsulating the first chip 120, the package 150, and the third chip 160. Thereby, the aforesaid elements can be prevented from being negatively affected by external conditions and particles.

Nevertheless, in the process of flip chip bonding the first chip 120 to the package substrate 110, the first chip 120 is terribly warped after the completion of the baking process performed on the underfill 130. This is because the package substrate 110 is the CSP substrate with a relatively thin thickness, and the first chip 120 is a thin chip having a thickness of 4 mils. As such, subsequent stacking processes performed on the package 150 may encounter operation difficulties.

SUMMARY OF THE INVENTION

The present invention is directed to a stacked type chip package structure and a method of fabricating a stacked type package structure. In the method, conventional manufacturing processes are performed in a different order, so as to resolve a conventional issue of a warped package substrate and a warped first chip due to an excessively thin thickness of the package substrate and the first chip.

The present invention provides a method of fabricating a stacked type chip package structure. The method includes following steps. First, a substrate, a first chip, and a second chip are provided. The substrate has an upper surface and a bottom surface opposite to the upper surface. The first chip has a first surface and a second surface opposite to the first surface. The second chip has a third surface and a fourth surface opposite to the third surface. Besides, the second chip includes a plurality of bumps disposed on the fourth surface of the second chip. Next, the third surface of the second chip is fixed to the second surface of the first chip. Thereafter, the second chip and the first chip are turned upside down on the upper surface of the substrate, and then the second chip is electrically connected to the substrate through the bumps by using a flip chip bonding technique. After that, the first chip is electrically connected to the substrate. Finally, a molding compound is formed on the substrate for encapsulating the first chip, the second chip, and the bumps.

According to an embodiment of the present invention, the step of fixing the second chip to the first chip is performed by forming an adhesive layer on the second surface of the first chip, such that the third surface of the second chip is fixed to the second surface of the first chip through the adhesive layer.

According to an embodiment of the present invention, the method of fabricating the stacked type chip package structure further includes performing a baking process for curing the adhesive layer.

According to an embodiment of the present invention, the step of electrically connecting the first chip to the substrate is performed by electrically connecting the first chip to the substrate through performing a wire bonding technique.

According to an embodiment of the present invention, after the second chip is electrically connected to the substrate through the bumps by using the flip chip bonding technique, the method of fabricating the stacked type chip package structure further includes forming an underfill between the second chip and the substrate for encapsulating the bumps.

According to an embodiment of the present invention, the method of fabricating the stacked type chip package structure further includes performing a baking process for curing the underfill.

According to an embodiment of the present invention, after the second chip is electrically connected to the substrate through the bumps by using the flip chip bonding technique, the method of fabricating the stacked type chip package structure further includes disposing a third chip on the first surface of the first chip and electrically connecting the third chip to the substrate.

According to an embodiment of the present invention, the third chip is electrically connected to the substrate by using a wire bonding technique.

According to an embodiment of the present invention, the method of fabricating the stacked type chip package structure further includes forming a plurality of solder balls on the bottom surface of the substrate.

The present invention further provides a method of fabricating a stacked type package structure. The method includes following steps. First, a first substrate, a chip package, and a second chip are provided. The chip package includes a second substrate, a first chip disposed on and electrically connected to the second substrate, and a first molding compound disposed on the second substrate for encapsulating the first chip. The first substrate and the second substrate respectively have an upper surface and a bottom surface opposite to the upper surface. The second chip has a first surface and a second surface opposite to the first surface. Besides, the second chip includes a plurality of bumps disposed on the second surface of the second chip. Next, the first surface of the second chip is fixed to the first molding compound. Thereafter, the second chip and the chip package are turned upside down on the upper surface of the first substrate, and then the second chip is electrically connected to the first substrate through the bumps by using a flip chip bonding technique. After that, the first substrate is electrically connected to the second substrate. Finally, a second molding compound is formed on the first substrate for encapsulating the chip package, the second chip, and the bumps.

According to an embodiment of the present invention, the first chip is electrically connected to the second substrate by using a wire bonding technique or the flip chip bonding technique.

According to an embodiment of the present invention, the step of fixing the first surface of the second chip to the first molding compound is performed by forming an adhesive layer on the first molding compound, such that the first surface of the second chip is fixed to the first molding compound through the adhesive layer.

According to an embodiment of the present invention, the method of fabricating the stacked type package structure further includes performing a baking process for curing the adhesive layer.

According to an embodiment of the present invention, the step of electrically connecting the first substrate to the second substrate is performed by electrically connecting the first substrate to the second substrate through performing a wire bonding technique.

According to an embodiment of the present invention, after the second chip is electrically connected to the first substrate through the bumps by using the flip chip bonding technique, the method of fabricating the stacked type package structure further includes forming an underfill between the second chip and the first substrate for encapsulating the bumps.

According to an embodiment of the present invention, the method of fabricating the stacked type package structure further includes performing a baking process for curing the underfill.

According to an embodiment of the present invention, after the second chip is electrically connected to the first substrate through the bumps by using the flip chip bonding technique, the method of fabricating the stacked type package structure further includes disposing a third chip on the bottom surface of the second substrate and electrically connecting the third chip to the first substrate.

According to an embodiment of the present invention, the third chip is electrically connected to the first substrate by using a wire bonding technique.

According to an embodiment of the present invention, the method of fabricating the stacked type package structure further includes forming a plurality of solder balls on the bottom surface of the first substrate.

In the stacked type chip package structure and the method of fabricating the stacked type package structure, two chips (or one chip and one chip package) are adhered to each other, and the adhered chips are turned upside down on the substrate for subsequently performing the flip chip bonding technique. The two adhered chips have a relatively great thickness in comparison with the conventional chip and, therefore, the conventional issue of the warped chip due to the thin thickness of the package substrate and the chip can then be resolved. In addition, the two chips are adhered to each other, and then the adhered chips are flip chip bonded onto the substrate according to the present invention, such that the subsequent processes can be easily implemented. Moreover, reliability of the stacked type chip package structure and the stacked type package structure formed by performing the method disclosed in the present invention can also be improved.

In order to make the aforementioned and other objects, features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
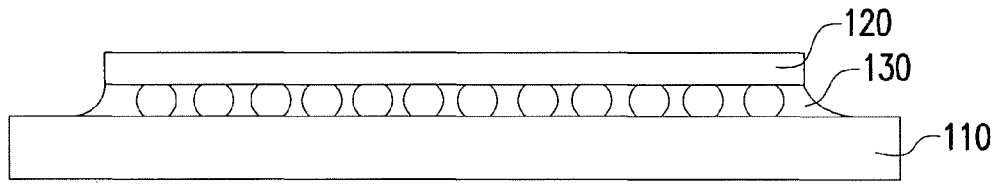
FIGS. 1A to 1D are schematic cross-sectional flowcharts showing a process of fabricating a stacked type package structure disclosed in R.O.C. patent publication no. 200608540.
Figure 1B:
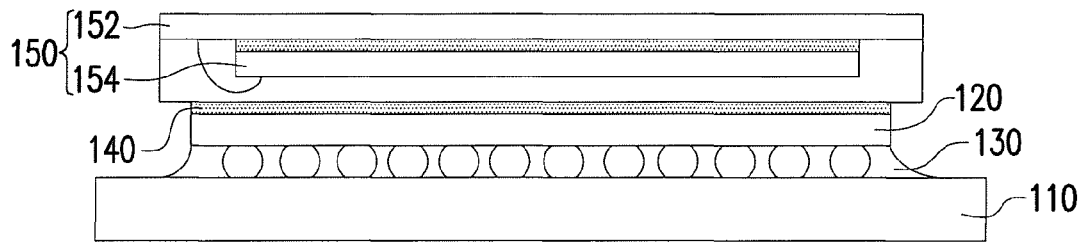
Figure 1C:
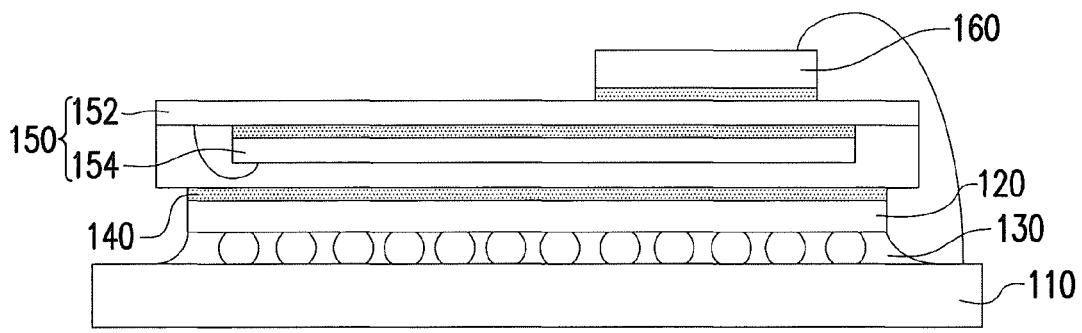
Figure 1D:
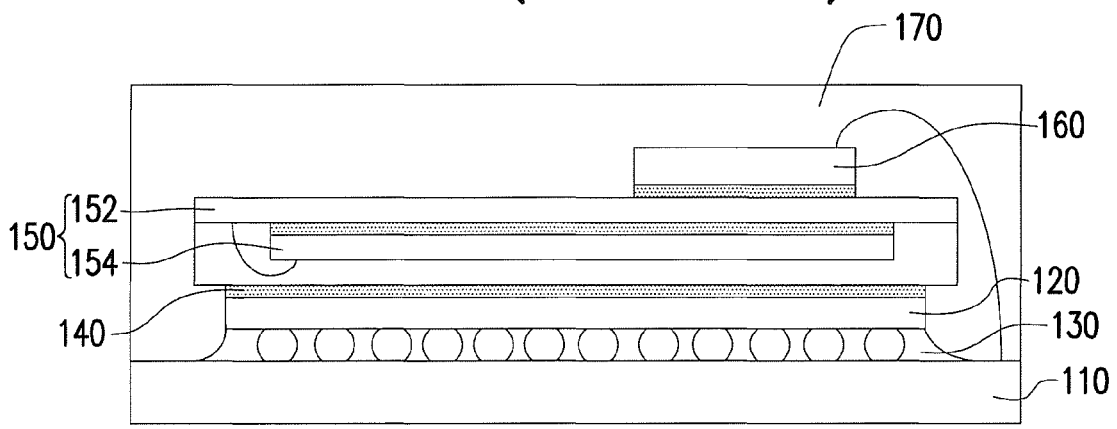

FIGS. 2A to 2F are schematic cross-sectional flowcharts showing a process of fabricating a stacked type chip package structure according to an embodiment of the present invention. First, referring to FIG. 2A, a substrate 210, a first chip 220, and a second chip 230 are provided. The substrate 210 has an upper surface 210a and a bottom surface 210b opposite to the upper surface 210a. The first chip 220 has a first surface 220a and a second surface 220b opposite to the first surface 220a. The second chip 230 has a third surface 230a and a fourth surface 230b opposite to the third surface 230a. Besides, the second chip 230 includes a plurality of bumps 232 disposed on the fourth surface 230b of the second chip 230. Next, referring to FIG. 2B, the third surface 230a of the second chip 230 is fixed to the second surface 220b of the first chip 220. In one embodiment of the present invention, the second chip 230 is fixed to the first chip 220 through an adhesive layer 240. The adhesive layer 240 is made of epoxy, an adhesive film, or other materials that can be used to adhere the first chip 220 to the second chip 230. In addition, a curing process, e.g., a baking process, can be performed based on the selected material of the adhesive layer 240, so as to cure the adhesive layer 240.

Figure 2A:
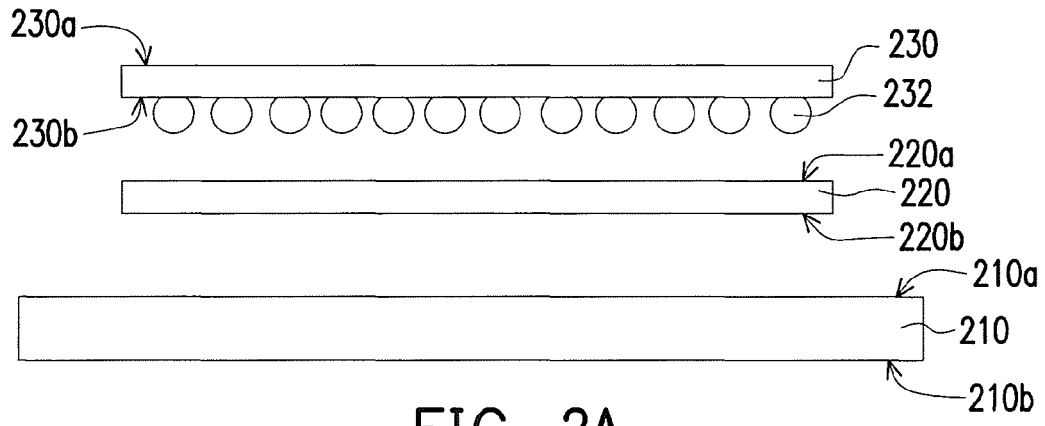
FIGS. 2A to 2F are schematic cross-sectional flowcharts showing a process of fabricating a stacked type chip package structure according to an embodiment of the present invention.
Figure 2B:
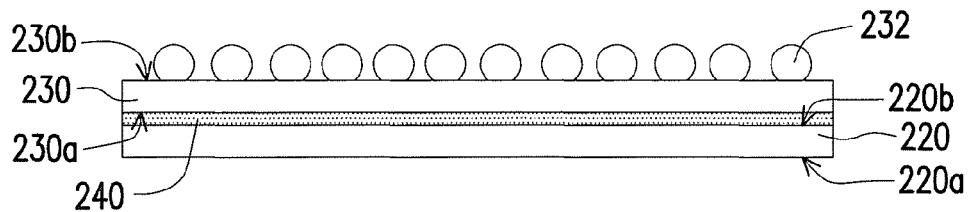
Figure 2C:
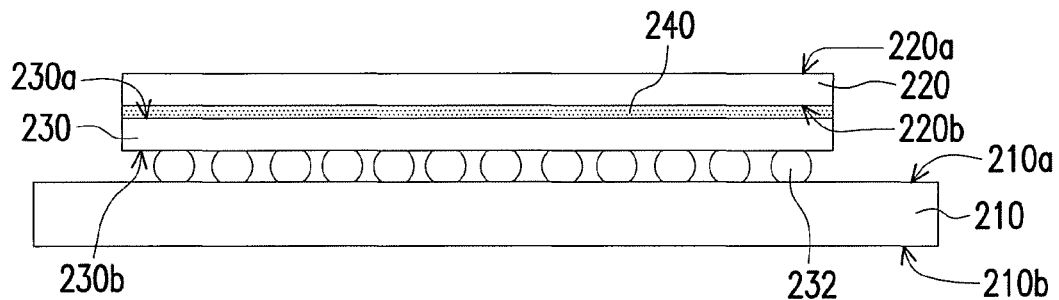
Figure 2D:
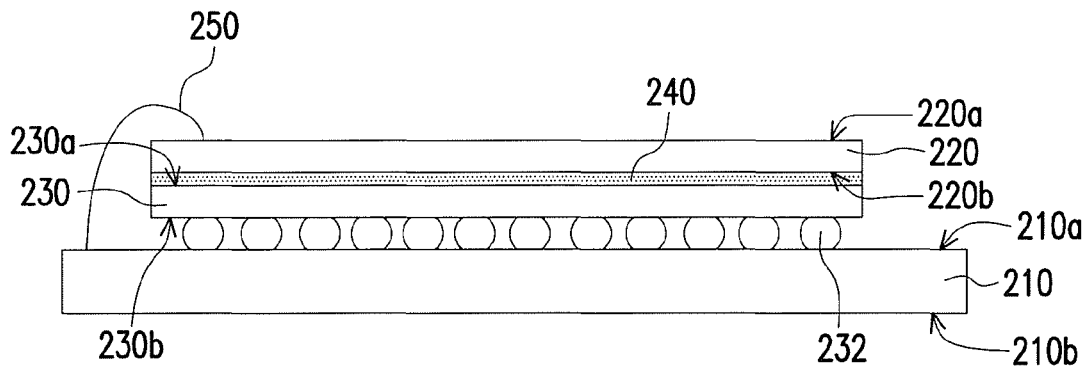
Figure 2E:
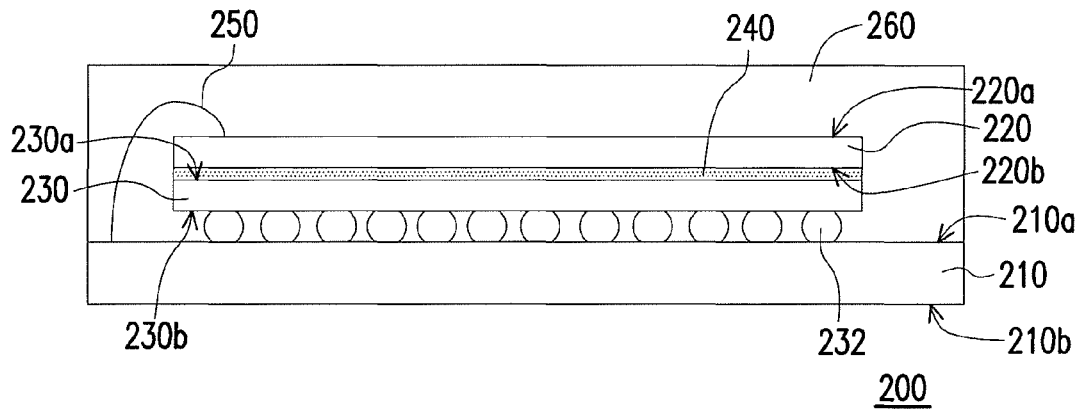

Thereafter, referring to FIG. 2C, the second chip 230 and the first chip 220 depicted in FIG. 2B are turned upside down on the upper surface 210a of the substrate 210, and then the second chip 230 is electrically connected to the substrate 210 through the bumps 232 by using a flip chip bonding technique. In this step, a reflow process is performed on the bumps 232, such that the second chip 230 is electrically connected to the substrate 210 through the bumps 232. After that, as shown in FIG. 2D, the first chip 220 is electrically connected to the substrate 210. In the present embodiment, a wire bonding technique is performed for forming a conductive wire 250 between the first chip 220 and the substrate 210, such that the first chip 220 is electrically connected to the substrate 210 through the conductive wire 250. Finally, referring to FIG. 2E, a molding compound 260 is formed on the substrate 210 for encapsulating the first chip 220 and the second chip 230. Besides, spaces among the bumps 232 are filled with the molding compound 260 for protecting the elements from damage and moisture. Up to here, the process of fabricating a stacked type chip package structure 200 is basically completed.

Figure 2F:
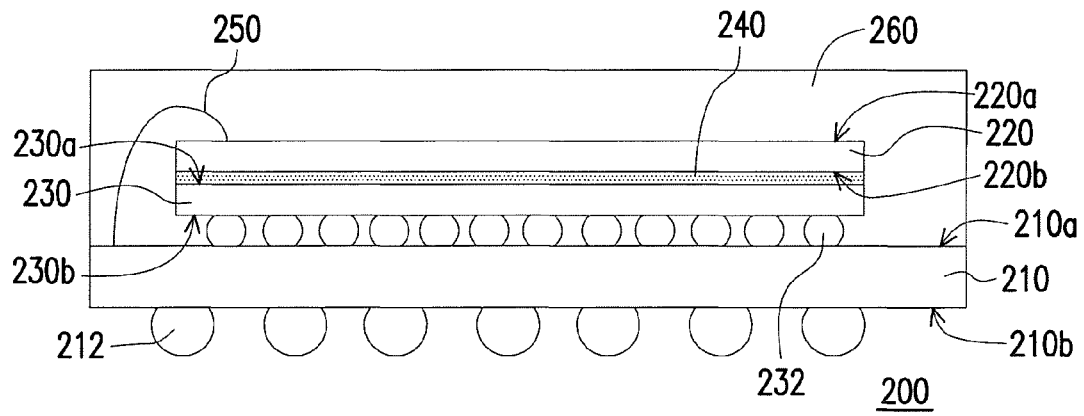

After the completion of said manufacturing process, as indicated in FIG. 2F, a plurality of solder balls 212 can be selectively formed on the bottom surface 210b of the substrate 210, such that the entire stacked type chip package structure 200 can be electrically connected to a circuit board or other electronic devices through the solder balls 212.

Figure 3:
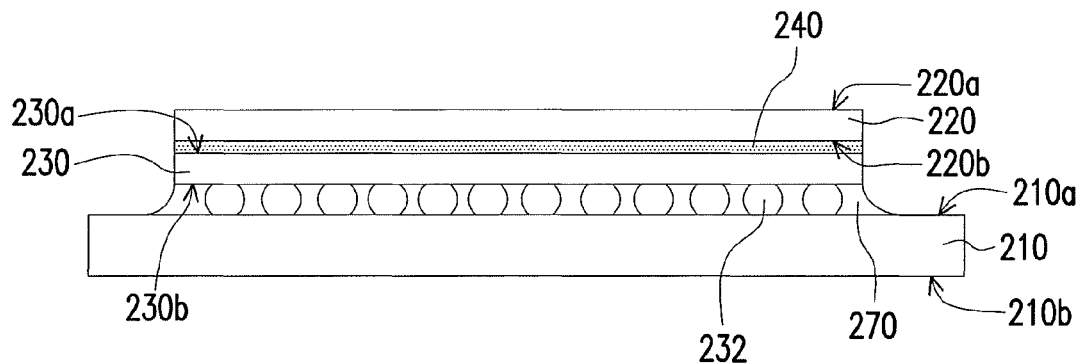
FIG. 3 is a schematic cross-sectional view showing a direct formation of an underfill between a first chip and a substrate after a flip chip bonding process depicted in FIG. 2C is completely performed.

Additionally, in the manufacturing process illustrated in FIGS. 2A to 2F, the chips are stacked first, and then molding compound 260 is formed for encapsulating all of the chips and bumps. Nevertheless, referring to FIG. 3, it is also likely to directly form an underfill 270 between the second chip 230 and the substrate 210 for encapsulating the bumps 232 after the flip chip bonding process depicted in FIG. 2C is completely implemented. Besides, after the formation of the underfill 270, the baking process is still required for curing the underfill 270. Likewise, the steps depicted in FIGS. 2D to 2E can still be performed after the formation of the underfill 270 is completed as depicted in FIG. 3, such that the stacked type chip package structure 200 is formed.

Figure 4:
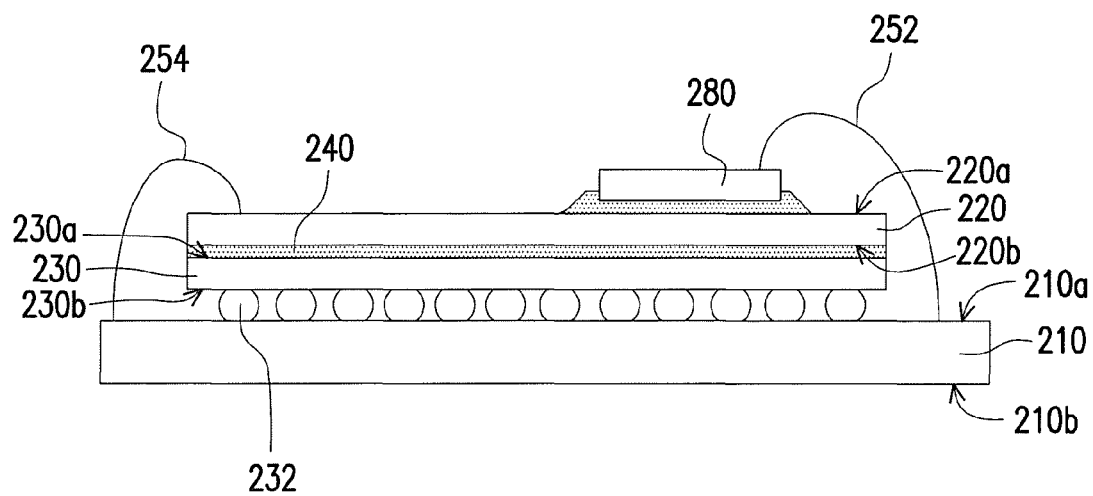
FIG. 4 is a schematic cross-sectional view showing a stacked type chip package structure formed by stacking three chips together.

In the previous embodiment, two chips are stacked together for exemplifying the present invention. However, referring to FIG. 4, when it is intended to stack three chips together, a third chip 280 can be fixed to the first surface 220a of the first chip 220 by performing a die attachment technique after the steps of FIG. 2C are all completed. Besides, the third chip 280 is electrically connected to the substrate 210. In one embodiment of the present invention, when the first chip 220 is electrically connected to the substrate 210 by using the wire bonding technique, a conductive wire 252 can be simultaneously formed between the third chip 280 and the substrate 210, such that the third chip 280 is electrically connected to the substrate 210 through the conductive wire 252. Thereafter, the three chips can be stacked after the step of forming the molding compound 260 is completely carried out.

Figure 5:
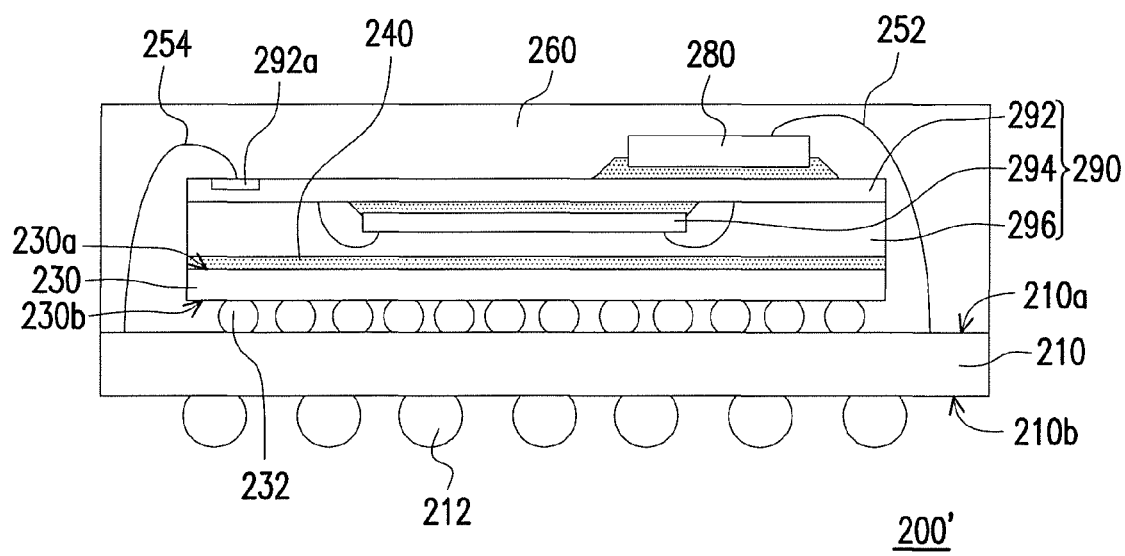
FIG. 5 is a schematic cross-sectional view of a stacked type package structure according to an embodiment of the present invention.

Moreover, the manufacturing process depicted in FIGS. 2A to 2E can be performed for stacking a packaged chip package (e.g. a CSP) to other chips, such that a stacked type package structure is formed. FIG. 5 is a schematic cross-sectional view of a stacked type package structure according to an embodiment of the present invention. A stacked type package structure 200' depicted in FIG. 5 and the stacked type chip package structure 200 depicted in FIG. 2F are fabricated by performing similar processes. The difference therebetween mainly rests in that a chip package 290 acting as a carrying member is used for fabricating the stacked type package structure 200', and the second chip 230 is fixed to the chip package 290. Thereafter, the same steps depicted in FIGS. 2C to 2F are performed, such that the stacked type package structure 200' can be formed. Specifically, as shown in FIG. 5, the chip package 290 includes a substrate 292, a chip 294, and a molding compound 296. The chip 294 is disposed on and electrically connected to the substrate 292. In the present embodiment, the chip 294 is electrically connected to the substrate 292 by using the wire bonding technique. The chip 294, however, can also be electrically connected to the substrate 292 by using the flip chip bonding technique, which is not limited in the present invention. The molding compound 296 is disposed on the substrate 292 and encapsulates the chip 294 and the conductive wire, so as to prevent the elements from damage and moisture.

In the subsequent step of electrically connecting the chip package 290 to the substrate 210, the wire bonding technique can also be applied, such that bonding pads 292a on the substrate 292 of the chip package 290 can be electrically connected to the substrate 210 through a conductive wire 254. Additionally, the third chip 280 can be disposed on the chip package 290 through performing the die attachment technique, so as to form the stacked type package structure 200' having one chip package and two chips. Since the stacked type package structure 200' depicted in FIG. 5 and the stacked type chip package structure 200 depicted in FIG. 2F are fabricated by performing similar processes, other detailed descriptions are omitted herein.

To sum up, in the method of fabricating the stacked type chip package structure and the stacked type package structure disclosed in the present invention, the chip or the chip package is used as the carrying member. Namely, two chips (or one chip and one chip package) are adhered to each other, and then the adhered chips on the substrate are turned upside down for performing the flip chip bonding technique. Conventionally, the package substrate and the chip have a thin thickness, and thus the issue of the warped chip may arise after the underfill is baked. By contrast, since the two adhered chips provided by the present invention have a relatively great thickness in comparison with the conventional chip, the issue of the warped chip can then be resolved. In addition, the two chips are adhered to each other, and then the adhered chips are flip chip bonded onto the substrate according to the present invention, such that the subsequent processes can be easily implemented. Moreover, reliability of the stacked type chip package structure and the stacked type package structure formed by performing the method disclosed in the present invention can also be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a stacked type package structure, comprising:

providing a first substrate, a chip package, and a second chip, wherein the chip package comprises a second substrate, a first chip disposed on and electrically connected to the second substrate, and a first molding compound disposed on the second substrate for encapsulating the first chip, the first substrate and the second substrate respectively having an upper surface and a bottom surface opposite to the upper surface, the second chip having a first surface and a second surface opposite to the first surface, and the second chip comprising a plurality of bumps disposed on the second surface thereof;

fixing the first surface of the second chip to the first molding compound;

turning the chip package and the second chip upside down on the upper surface of the first substrate and electrically connecting the second chip to the first substrate through the bumps by using a flip chip bonding technique, wherein the second chip is bonded to the chip package before being bonded to the first substrate;

electrically connecting the first substrate to the second substrate; and forming a second molding compound on the first substrate for encapsulating the chip package, the second chip, and the bumps.

2. The method of fabricating the stacked type package structure as claimed in claim 1, wherein the first chip is electrically connected to the second substrate by using a wire bonding technique or a flip chip bonding technique.

3. The method of fabricating the stacked type package structure as claimed in claim 1, wherein the step of fixing the first surface of the second chip to the first molding compound is performed by forming an adhesive layer on the first molding compound, such that the first surface of the second chip is fixed to the first molding compound through the adhesive layer.

4. The method of fabricating the stacked type package structure as claimed in claim 3, further comprising performing a baking process for curing the adhesive layer.

5. The method of fabricating the stacked type package structure as claimed in claim 1, wherein the step of electrically connecting the first substrate to the second substrate is performed by using a wire bonding technique.

6. The method of fabricating the stacked type package structure as claimed in claim 1, further comprising forming an underfill between the second chip and the first substrate for encapsulating the bumps after electrically connecting the second chip to the first substrate through the bumps by using a flip chip bonding technique.

7. The method of fabricating the stacked type package structure as claimed in claim 6, further comprising performing a baking process for curing the underfill.

8. The method of fabricating the stacked type package structure as claimed in claim 1, further comprising disposing a third chip on the bottom surface of the second substrate and electrically connecting the third chip to the first substrate after electrically connecting the second chip to the first substrate through the bumps by using the flip chip bonding technique.

9. The method of fabricating the stacked type package structure as claimed in claim 8, wherein the third chip is electrically connected to the first substrate by using a wire bonding technique.

10. The method of fabricating the stacked type package structure as claimed in claim 1, further comprising forming a plurality of solder balls on the bottom surface of the first substrate.

11. A method of fabricating a stacked type package structure, comprising:

bonding a first chip onto a first surface of a first substrate;

encapsulating the first chip by forming a first molding compound on the first surface of the first substrate to form a package unit;

attaching a second chip onto the first molding compound;

after attaching the second chip onto the first molding compound, integrating the package unit with a second substrate by flip-chip bonding the second chip onto the second substrate;

electrically connecting a contact on a second surface of the first substrate to the second substrate, the second surface being opposite to the first surface; and encapsulating the package unit and the second chip by forming a second molding compound on the second substrate.

12. The method of fabricating the stacked type package structure as claimed in claim 11, wherein the first chip is bonded to the first substrate by a wire bonding technique or a flip chip bonding technique.

13. The method of fabricating the stacked type package structure as claimed in claim 11, wherein the step of attaching a second chip onto the first molding compound comprises forming an adhesive layer between the second chip and the first molding compound.

14. The method of fabricating the stacked type package structure as claimed in claim 13, further comprising curing the adhesive layer.

15. The method of fabricating the stacked type package structure as claimed in claim 11, further comprising forming an underfill between the second chip and the second substrate for encapsulating a plurality of bumps electrically connected between the second chip and the second substrate.

16. The method of fabricating the stacked type package structure as claimed in claim 15, further comprising curing the underfill.

17. The method of fabricating the stacked type package structure as claimed in claim 11, further comprising bonding a third chip onto the second surface of the first substrate.

18. The method of fabricating the stacked type package structure as claimed in claim 17, further comprising electrically connecting the third chip to the second substrate.

19. The method of fabricating the stacked type package structure as claimed in claim 18, wherein the third chip is electrically connected to the second substrate by wire bonding technique.

20. The method of fabricating the stacked type package structure as claimed in claim 11, further comprising forming a plurality of solder balls on a bottom surface of the second substrate.

* * * * *